United States Patent
Song et al.

(10) Patent No.: US 10,862,296 B2
(45) Date of Patent: Dec. 8, 2020

(54) APPARATUS AND METHOD FOR PROTECTING MOSFET RELAY BY USING VOLTAGE DETECTOR AND SIGNAL FUSE

(71) Applicant: LG CHEM, LTD., Seoul (KR)

(72) Inventors: Hyeon Jin Song, Daejeon (KR); Chang Bog Lee, Daejeon (KR); Yanglim Choi, Daejeon (KR)

(73) Assignee: LG CHEM, LTD., Seoul (KR)

(*) Notice: Subject to any disclaimer, the term of this patent is extended or adjusted under 35 U.S.C. 154(b) by 330 days.

(21) Appl. No.: 16/079,487

(22) PCT Filed: Apr. 10, 2017

(86) PCT No.: PCT/KR2017/003869
§ 371 (c)(1),
(2) Date: Aug. 23, 2018

(87) PCT Pub. No.: WO2017/179869
PCT Pub. Date: Oct. 19, 2017

(65) Prior Publication Data
US 2019/0052257 A1    Feb. 14, 2019

(30) Foreign Application Priority Data

Apr. 11, 2016    (KR) .................. 10-2016-0044285

(51) Int. Cl.
*H02H 7/20*    (2006.01)
*B60L 15/22*    (2006.01)
(Continued)

(52) U.S. Cl.
CPC ............... *H02H 7/20* (2013.01); *B60L 15/22* (2013.01); *B60L 50/60* (2019.02); *G01R 1/20* (2013.01);
(Continued)

(58) Field of Classification Search
CPC .......... B60L 50/60; B60L 15/22; G01R 1/20; G01R 19/00; G01R 19/165;
(Continued)

(56) References Cited

U.S. PATENT DOCUMENTS 4,346,424 A * 8/1982 Hansen .................. H02H 3/087
361/111
5,659,454 A * 8/1997 Vermesse ......... G07B 17/00193
337/371
(Continued)

FOREIGN PATENT DOCUMENTS

CN    102129037 A    7/2011
EP    0 896 410 A2    2/1999
(Continued)

OTHER PUBLICATIONS

International Search Report for PCT/KR2017/003869 (PCT/ISA/210) dated Jul. 21, 2017.
(Continued)

*Primary Examiner* — Yusef A Ahmed
(74) *Attorney, Agent, or Firm* — Birch, Stewart, Kolasch & Birch LLP

(57) ABSTRACT

The present invention relates to an apparatus and a method for protecting a MOSFET relay by using a voltage detector and a signal fuse, which calculate a detection voltage value through a voltage detector from an electrically conducted current value of a MOSFET relay provided in a battery main circuit for a vehicle and pre-block current applied to the MOSFET relay by operating a signal fuse when the calculated voltage value is more than a predetermined threshold to protect the MOSFET relay from being burned.

4 Claims, 2 Drawing Sheets

(51) Int. Cl.
  *H02H 3/20* (2006.01)
  *G01R 1/20* (2006.01)
  *G01R 19/00* (2006.01)
  *G01R 19/165* (2006.01)
  *H02H 3/08* (2006.01)
  *B60L 50/60* (2019.01)
  *H02H 1/00* (2006.01)
  *H03K 17/082* (2006.01)

(52) U.S. Cl.
  CPC ............ *G01R 19/00* (2013.01); *G01R 19/165* (2013.01); *G01R 19/16576* (2013.01); *H02H 1/0007* (2013.01); *H02H 3/08* (2013.01); *H02H 3/20* (2013.01); *H03K 17/0822* (2013.01); *Y02T 10/70* (2013.01); *Y02T 10/72* (2013.01); *Y02T 90/14* (2013.01)

(58) Field of Classification Search
  CPC .. G01R 19/16576; H02H 1/0007; H02H 3/08; H02H 3/20; H02H 7/20; H03K 17/0822
  See application file for complete search history.

(56) References Cited

U.S. PATENT DOCUMENTS

| | | | | |
|---|---|---|---|---|
| 5,746,053 A | 5/1998 | Hibino | | |
| 6,051,954 A * | 4/2000 | Nagao | ............ | F21S 9/032 320/101 |
| 6,286,976 B1 * | 9/2001 | Chopra | ............ | B60Q 3/74 315/77 |
| 6,288,881 B1 * | 9/2001 | Melvin | ............ | H02J 7/1461 361/18 |
| 6,349,023 B1 * | 2/2002 | Greenberg | ............ | H05B 45/10 361/103 |
| 6,960,903 B2 * | 11/2005 | Yamamoto | ............ | H02M 1/32 323/282 |
| 7,304,828 B1 | 12/2007 | Shvartsman | | |
| 7,710,070 B2 * | 5/2010 | Mori | ............ | H01M 10/48 320/112 |
| 7,952,330 B2 * | 5/2011 | Mori | ............ | H01M 2/34 320/150 |
| 8,687,338 B2 * | 4/2014 | Odaohhara | ............ | H02J 7/0031 361/104 |
| 9,450,401 B2 * | 9/2016 | Li | ............ | H02H 9/026 |
| 2003/0112571 A1 * | 6/2003 | Burdick | ............ | H03K 17/18 361/104 |
| 2004/0012493 A1 * | 1/2004 | Park | ............ | G08B 13/19 340/545.1 |
| 2007/0188148 A1 * | 8/2007 | Kawasumi | ............ | H02J 7/0031 320/134 |
| 2008/0116851 A1 * | 5/2008 | Mori | ............ | H02J 7/0029 320/134 |
| 2008/0236295 A1 * | 10/2008 | Hsieh | ............ | G01F 1/28 73/861.08 |
| 2011/0019326 A1 * | 1/2011 | Odaohhara | ............ | H02J 7/0029 361/104 |
| 2011/0273137 A1 * | 11/2011 | Nakatsuji | ............ | H01M 2/34 320/107 |
| 2014/0177119 A1 * | 6/2014 | Ueda | ............ | H02H 3/046 361/93.8 |
| 2014/0285935 A1 * | 9/2014 | Tsai | ............ | H02H 3/087 361/86 |
| 2016/0099559 A1 * | 4/2016 | Fernandez-Guerrero | ............ | H02H 1/0007 361/86 |
| 2017/0365991 A1 * | 12/2017 | Kumagai | ............ | H02G 3/16 |
| 2018/0040443 A1 | 2/2018 | Yokota et al. | | |
| 2018/0069394 A1 * | 3/2018 | Hagen | ............ | G01R 21/133 |
| 2018/0083435 A1 * | 3/2018 | Redler | ............ | H02H 3/085 |
| 2019/0120878 A1 * | 4/2019 | Kim | ............ | G01R 15/04 |
| 2019/0162787 A1 * | 5/2019 | Hurwicz | ............ | H02H 1/0007 |

FOREIGN PATENT DOCUMENTS

| | | |
|---|---|---|
| JP | 6-205537 A | 7/1994 |
| JP | 11-51983 A | 2/1999 |
| JP | 2011-23317 A | 2/2011 |
| JP | 2015-128361 A | 7/2015 |
| KR | 10-0781131 B1 | 11/2007 |
| KR | 10-2008-0015215 A | 2/2008 |
| KR | 10-1369032 B1 | 2/2014 |
| KR | 10-2016-0029082 A | 3/2016 |
| WO | WO 2014/109364 A1 | 7/2014 |

OTHER PUBLICATIONS

Extended European Search Report dated Feb. 12, 2019 for Application No. 17782624.5.

* cited by examiner

[Figure 1]
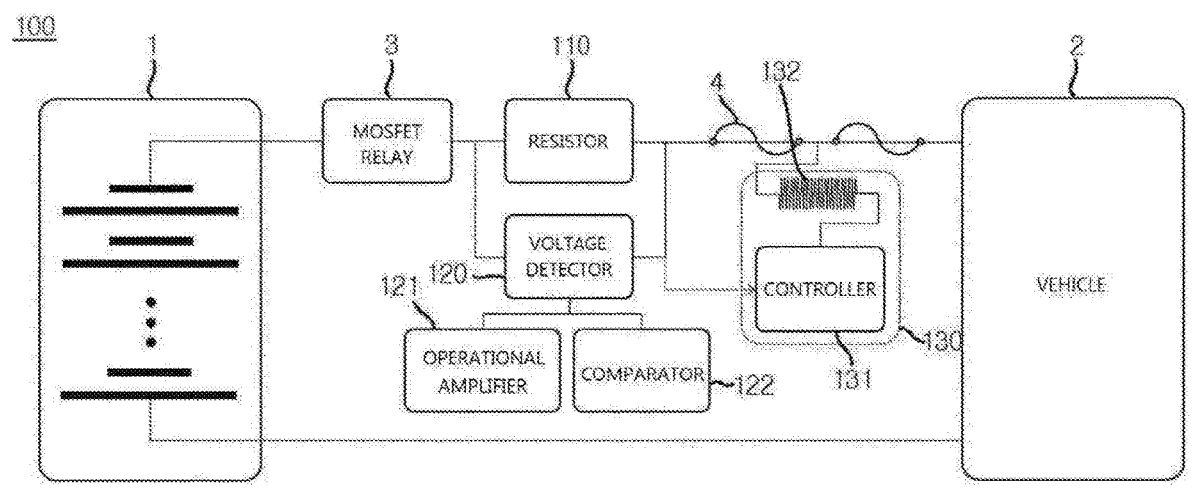

[Figure 2]
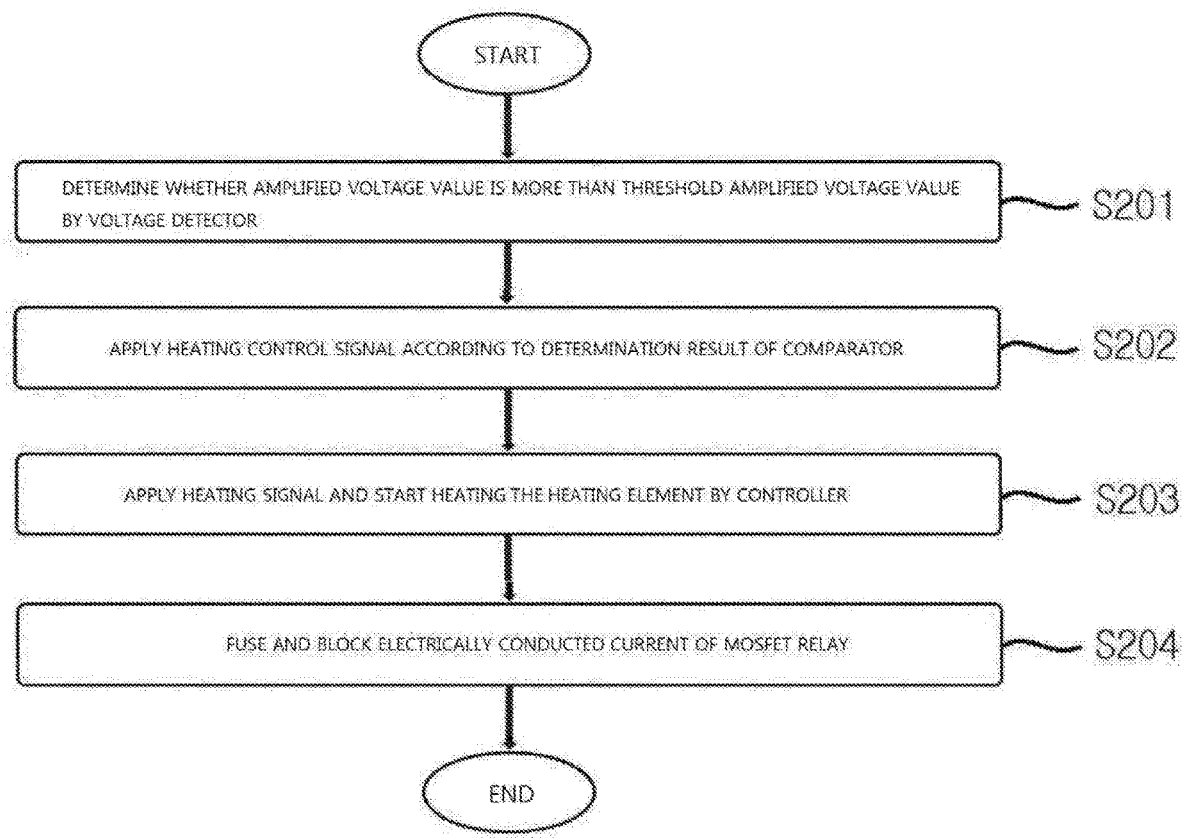

APPARATUS AND METHOD FOR PROTECTING MOSFET RELAY BY USING VOLTAGE DETECTOR AND SIGNAL FUSE

TECHNICAL FIELD

This application claims priority to and the benefit of Korean Patent Application No. 10-2016-0044285 filed in the Korean Intellectual Property Office on Apr. 11, 2016, the entire contents of which are incorporated herein by reference.

The present invention relates to an apparatus and a method for protecting a MOSFET relay by using a voltage detector and a signal fuse, and more particularly, to an apparatus and a method for protecting a MOSFET relay by using a voltage detector and a signal fuse, which calculate a detection voltage value through a voltage detector from an electrically conducted current value of a MOSFET relay provided in a battery main circuit for a vehicle and pre-block current applied to the MOSFET relay by operating a signal fuse when the calculated voltage value is more than a predetermined threshold to protect the MOSFET relay from being burned.

BACKGROUND ART

In general, in the case of a plug-in hybrid electric vehicle (PHEV) that travels by using energy output from a battery as a power source, it is necessary to charge an internal battery by driving a vehicle motor and in this case, an element called a relay is used to apply current which flows between a charge source and a battery or block the current between the charge source and the battery.

Moreover, when various elements need to be protected in a situation in which overcurrent which is more than a threshold flows on an internal circuit of the electric vehicle, a state of the relay is changed from an on state to an off state, and as a result, the current on the circuit is blocked to protect various elements.

Meanwhile, in the electric vehicle, in the case of a relay, especially, a mechanical relay, there are problems such as frequent noise generation and frequent maintenance due to welding. Therefore, in order to solve the problems, the relay is implemented and applied by using a metal oxide silicon field effect transistor (MOSFET) which is a semiconductor device instead of the mechanical relay.

In this case, since there is a fear that the MOSFET relay may be burned or destroyed when overcurrent (for example, current of 1000 A or more) is applied due to characteristics of the device. Therefore, a separate blocking apparatus is required, which is capable of preventing the burning or destroying, but in the related art as the separate blocking apparatus is not present, which is capable of protecting the MOSFET relay itself from being burned, the burned MOSFET relay needs to be replaced with a new MOSFET relay every time.

Accordingly, the present inventor has invented an apparatus and a method for protecting a MOSFET relay by using a voltage detector and a signal fuse, which calculate a detection voltage value through a voltage detector from an electrically conducted current value of a MOSFET relay provided in a battery main circuit for a vehicle and pre-block current applied to the MOSFET relay by operating a signal fuse when the calculated voltage value is more than a predetermined threshold to protect the MOSFET relay from being burned, in order to solve the problem of a circuit implemented through the MOSFET relay in the related art.

DETAILED DESCRIPTION OF THE INVENTION

Technical Problem

The present invention is contrived to solve the problem and the present invention has been made in an effort to provide an apparatus and a method for protecting a MOSFET relay by using a voltage detector and a signal fuse, which calculate a detection voltage value through a voltage detector from an electrically conducted current value of a MOSFET relay provided in a battery main circuit for a vehicle and pre-block current applied to the MOSFET relay by operating a signal fuse when the calculated voltage value is more than a predetermined threshold to protect the MOSFET relay from being burned.

Technical Solution

Among embodiments according to the present invention, an apparatus for protecting a MOSFET relay may include: a voltage detector calculating a voltage value of current which is electrically conducted to a resistor and determining whether the voltage value is more than a threshold; and a short circuit unit short-circuiting a fuse on a circuit according to a determination result of the voltage detector.

In the embodiment, as the fuse is short-circuited, current electrically conducted to the MOSFET relay connected to the resistor may be blocked.

In the embodiment, the voltage detector may include an operational amplifier (OP Amp) amplifying the voltage value and outputting an amplified voltage value, and a comparator determining whether the amplified voltage value is more than a predetermined threshold amplified voltage value.

In the embodiment, the short circuit unit may include a controller receiving a heating control signal from the voltage detector, and a heating element connected with the fuse and generating heat by a heating signal applied from the controller, and as the heating element generates the heat, the fuse may be short-circuited.

In the embodiment, as the determination result of the comparator, when the amplified voltage value is more than the threshold amplified voltage value, the voltage detector may apply the heating control signal to the controller and the controller may heat the heating element by the heating control signal.

In the embodiment, the controller may be a field effect transistor (FET), and the heating element may be a heating resistor including a positive temperature coefficient (PTC) material.

In the embodiment, the resistor may be a shunt resistor.

In the embodiment, the short circuit unit may be a signal fuse.

According to another embodiment of the present invention, a method for protecting a MOSFET relay may include: calculating, by a voltage detector, a voltage value of current which is electrically conducted to a resistor and determining whether the voltage value is more than a threshold; and short-circuiting, by a short circuit unit, a fuse on a circuit according to a determination result of the voltage detector.

In the embodiment, the determining of whether the voltage value is more than the threshold may include measuring a current value of the current electrically conducted to the resistor, calculating the voltage value of the current based on the current value and a resistance value of the resistor, amplifying the voltage value to the amplified voltage value through an operational amplifier (OP Amp), and determining, by a comparator, whether the amplified voltage value is more than a predetermined threshold amplified voltage value.

In the embodiment, the short-circuiting of the fuse may include applying, by the voltage detector, a heating control signal to the short circuit unit, heating, by a controller included in the short circuit unit, a heating element, and short-circuiting the fuse as the heating element is heated.

In the embodiment, the determining of whether the amplified voltage value is more than the predetermined threshold amplified voltage value may include setting the threshold amplified voltage value based on a threshold current range corresponding to a current value of 500 to 1000 amperes.

Advantageous Effects

According to an embodiment of the present invention, an apparatus and a method for protecting a MOSFET relay have an advantage of protecting a MOSFET relay element itself from overcurrent by preventing current which is more than an electric conduction capability (1000 amperes, etc.) of the MOSFET relay before applying the current to the MOSFET relay.

Further, the present invention has an advantage of more easily setting a threshold amplification voltage value by amplifying a voltage difference between both terminals of a resistor minutely output as 0.5 V or less through an operation amplifier (OP Amp).

BRIEF DESCRIPTION OF DRAWINGS

FIG. 1 is a diagram schematically illustrating a configuration of an apparatus 100 for protecting a MOSFET relay according to an embodiment of the present invention.

FIG. 2 is a flowchart schematically illustrating an order of protecting the MOSFET relay through the apparatus 100 for protecting a MOSFET relay, which is illustrated in FIG. 1.

BEST MODE

Hereinafter, a preferred embodiment is presented in order to assist understanding of the present invention. However, the following embodiment is just provided to more easily understand the present invention and contents of the present invention are not limited by the embodiment.

In addition, a battery module 1 shown in the drawings of the specification may refer to a secondary battery applicable to a plug in hybrid electric vehicle (PHEV) or an electric vehicle (EV) and a vehicle 2 may mean the plug in hybrid electric vehicle or the electric vehicle as described above.

Further, in the specification, a MOSFET relay 3 may mean a device implementing a relay (switching device) using a metal oxide semiconductor field effect transistor (MOSFET) and in this case, the detailed description of the MOSFET relay 3 device itself will be omitted because the MOSFET relay 3 adopts a technique known in the related art.

Further, in the specification, a fuse 4 may mean a device which is generally provided on a circuit and fused by overcurrent to serve to cut off current in the circuit. Likewise, since the fuse 4 uses the technique known in the related art, the detailed description of the fuse 4 device itself will be omitted.

FIG. 1 is a diagram schematically illustrating a configuration of an apparatus 100 for protecting a MOSFET relay according to an embodiment of the present invention.

Referring to FIG. 1, the apparatus 100 for protecting a MOSFET relay according to the embodiment of the present invention may be configured to include a resistor 110 connected to the MOSFET relay 3, a voltage detector 120, and a short-circuit unit 130.

First, the resistor 110 is positioned between the MOSFET relay 3 and the fuse 4 and may serve as a means for measuring a current value transmitted from the fuse 4 to the MOSFET relay 3.

More specifically, the resistor 110 may be applied with a shunt resistor (or a classification resistor) with a very low resistance value (e.g., 0.001 ohm, etc.) and when an electric conduction current value corresponds to overcurrent of 500 amperes or more and it is thus difficult to connect a voltage measurer (not illustrated) in series, the current value may be inversely calculated using the resistor 110 such as the shunt resistor.

A process of inversely calculating the current value by using the resistor 110 such as the shunt resistor will be schematically described below.

$$V = I * R \quad \text{[Equation 1]}$$

Herein, V represents a voltage value (v), I represents the current value (A), and R represents a resistance value (Ω).

As an example, when the voltage value V of the current outputted from the battery module 1 is 5 V and the resistance value R is 0.001Ω, it can be seen that the current value is calculated as 5/0.001=500 A by the equation.

As another example, when the voltage value V of the current outputted from the battery module 1 is 10 V and the resistance value R is 0.001Ω, it can be seen that the current value is calculated as 10/0.001=1000 A by the equation.

As described above, when the current value of the current outputted from the battery module 1 corresponds to a very large overcurrent, the resistor 110 according to the present invention may be used to calculate the current value inversely. Meanwhile, since the resistor 110 described in the specification uses the shunt resistor known in the related art, a more detailed description thereof will be omitted.

Next, the voltage detector 120 may serve to calculate the voltage value of the current electrically conducted to the resistor 110 and determine whether the voltage value exceeds a threshold.

More specifically, the voltage detector 120 amplifies the corresponding voltage value by a predetermined multiple number by calculating an electrically conducted voltage value by using the current value of the current electrically conducted along both terminals of the resistor 110 and the resistance value of the resistor 110 and compares the amplified voltage value with a predetermined threshold amplified voltage value to serve to determine whether the amplified voltage value is more than the predetermined threshold amplified voltage value and the role of the voltage detector 120 may be implemented through an operational amplifier 121 and a comparator 122.

The operational amplifier (OP Amp) 121 amplifies the calculated voltage value by a predetermined multiple number (for example, 10 times or 20 times) to facilitate comparison of the voltage of the comparator 122 to be described below.

An initial voltage value calculated through the voltage detector 120 is calculated as fine minute voltage such as 0.5 V, 0.6 V, or 0.7 V due to an excessive current value (for example, 500 A or more) of the current which is electrically conducted to the resistor 110. Therefore, by amplifying such minute voltage by 20 times, or the like, the voltage value may be more easily compared in the comparator 122 described below.

For example, when the initial voltage value calculated through the voltage detector 122 is 0.5 V, the operational amplifier 121 amplifies the initial voltage value by 20 times and accordingly outputs the amplified voltage value corresponding to 10 V. The amplified voltage value thus outputted may be used for determining the overcurrent of the electrical conducted current in the comparator 122 to be described below.

In the embodiment, the operational amplifier 121 may also serve to amplify a threshold voltage range predetermined by a user.

Herein, the threshold voltage range predetermined by the user may mean a voltage protection area that the user arbitrarily sets in order to protect the MOSFET relay 3 from being burned and may mean an interval of a maximum voltage value at which the MOSFET relay 3 operates to a voltage value at the time when the MOSFET relay 3 is burned such as 0.5 V to 1.0 V.

In this case, the threshold voltage range is minute like 0.5 V to 1.0 V due to the excessive current value (for example, 500 A or more) of the current which is electrically conducted to the resistor 110 as described above and the operational amplifier 121 amplifies such a minute threshold voltage range by the predetermined multiple number (for example, 20 times, etc.), and as a result, the threshold amplification voltage range corresponding to 10 V to 20 V is output. The output threshold amplification voltage range may serve as an overcurrent judgment reference range of the comparator 122 to be described below.

The comparator 122 compares the amplified voltage value output from the operational amplifier 121 and the threshold amplified voltage value to serve to determine whether the amplified voltage value is more than the threshold amplified voltage value.

Herein, the threshold amplified voltage value may mean a threshold (for example, 13 V) set by the user within the threshold amplified voltage range (10 V to 20 V) output from the operational amplifier 121 and in this case, it is noted that a value of the threshold amplified voltage value may be changed at any time according to setting by the user.

For example, assuming that the threshold amplified voltage value set by the user is 13 V, the comparator 122 determines that the amplified voltage value which is more than 10 V and less than 13 V is not more than the threshold amplified voltage value, but determines that the amplified voltage value which is more than 13 V is more than the threshold amplified voltage value to apply a heating control signal to the short-circuit unit 130 to be described below.

In this case, since the current value 650 A corresponding to 13 V is not an overcurrent enough to burn the MOSFET relay 3, but already exceeds the maximum current value (520 A) at which the MOSFET relay 3 operates, a current value of 650 A or more may be meaningless and in particular, when the amplified voltage value is more than 13 V to be close to 20 V (a current value (1000 A) at which the MOSFET relay 3 is burned), the MOSFET relay 3 may be dangerous.

Therefore, the comparator 122 may determine that the amplified voltage value which is more than 13 V is more than the threshold amplified voltage value and allow the short circuit unit 130 to be described below to short-circuit the fuse 4.

Next, since the short circuit unit 130 may serve to short circuit the fuse 4 according to a result of determining whether the amplified voltage value is more than the threshold amplified voltage value by the comparator 122 and may fuse the fuse through the heating control signal, the short circuit unit 130 may be also referred to as a signal fuse.

The short circuit unit 130 may be configured to include a controller 131 and a heating element 132 and roles thereof are described below.

The controller 131 receives the heating control signal from the comparator 122 and then applies a heating signal to the heating element 132 to be described below to serve to heat the heating element 132.

The controller 131 may adopt a switching device such as a field effect transistor (FET) and it is noted that devices which may serve as the switching device are not limited as an adaptation target of the controller 131 in addition to the field effect transistor (FET).

The heating element 132 may be directly or indirectly adjacently connected to the fuse 4 of the circuit and the heating element 132 may serve to receive the heating signal from the controller 131 and generate heat at a high temperature to fuse the fuse 4.

The heating element 132 may adopt a heating element that emits the heat at the high temperature due to rapid rise of the resistance value by current which flows for an extremely short time such as a positive temperature coefficient thermistor (PTC), etc., and it is noted that devices which may serve as the heating element are not limited as the adaptation target of the heating element 132 in addition to the PTC.

Next, an order in which the apparatus 100 for protecting a MOSFET relay operates will be schematically described through FIG. 2.

Referring to FIG. 2, first, the amplified voltage value is output by calculating and amplifying the voltage value of the current which is electrically conducted to the resistor 110 through the voltage detector 120 connected with both terminals of the resistor 110 and it is determined whether the amplified voltage value is more than a threshold amplified voltage value (S201).

Next, when it is determined that the amplified voltage value is more than the threshold amplified voltage value, the comparator 122 applies the heating control signal to the controller 131 (S202), and as a result, the controller 131 applies the heating signal to the heating element 132 to heat the heating element 132 (S203).

As a result, the fuse 4 is fused by the heat generation by the heating element 132 and the MOSFET relay 3 is protected from the overcurrent (S204).

The present invention has been described with reference to the preferred embodiments, but those skilled in the art will understand that the present invention can be variously modified and changed without departing from the spirit and the scope of the present invention which are defined in the appended claims.

The invention claimed is:

1. An apparatus for protecting a MOSFET relay, the apparatus comprising:
   a fuse;
   a resistor positioned directly between the MOSFET relay and the fuse;
   a voltage detector calculating a voltage value of current which is electrically conducted to the resistor and determining whether the voltage value is more than a threshold; and
   a short circuit unit short-circuiting the fuse according to a determination result of the voltage detector, wherein as the fuse is short-circuited, current electrically conducted to the MOSFET relay connected to the resistor is blocked, wherein the voltage detector includes an operational amplifier (OP Amp) amplifying the voltage value and outputting an amplified voltage value, and a comparator determining whether the amplified voltage value is more than a predetermined threshold amplified voltage value, wherein the short circuit unit includes:

a controller receiving a heating control signal from the voltage, detector, and a heating element connected with the fuse and configured to generate heat by a heating signal applied from the controller to cause the fuse to short-circuit, and wherein the heating element is provided directly between the fuse and the controller, and wherein as the determination result of the comparator when the amplified voltage value is more than the predetermined threshold amplified voltage value the voltage detector applies the heating control signal to the controller and the controller heats the heating element by the heating control signal.

2. The apparatus of claim 1, wherein the controller is a field effect transistor (FET), and wherein the heating element is a heating resistor including a positive temperature coefficient (PTC) material.

3. The apparatus of claim 1, wherein the resistor is a shunt resistor.

4. A method for protecting a MOSFET relay, the method comprising:

calculating, by a voltage detector, a voltage value of current which is electrically conducted to a resistor;

determining, by the voltage detector, whether the voltage value is more than a threshold; and short-circuiting, by a short circuit unit, a fuse according to a determination result of the voltage detector;

wherein the resistor positioned directly between the MOSFET relay and the fuse, wherein the determining of whether the voltage value is more than the threshold includes:

measuring a current value of the current electrically conducted to the resistor;

calculating the voltage value of the current based on the current value and a resistance value of the resistor;

amplifying the voltage value to the amplified voltage value through an operational amplifier (OP Amp); and determining, by a comparator, whether the amplified voltage value is more than a predetermined threshold amplified voltage value, wherein the short-circuiting of the fuse includes:

applying, by the voltage detector, a heating control signal to the short circuit unit; and heating, by a controller included in the short circuit unit, a heating element to cause the fuse to short-circuit, wherein the heating element is provided directly between the fuse and the controller, and wherein the determining of whether the amplified voltage value is more than the predetermined threshold amplified voltage value includes setting the predetermined threshold amplified voltage value based on a threshold current range corresponding to a current value of 500 to 1000 amperes.

* * * * *